United States Patent [19]
Fetterman

[11] Patent Number: 5,936,849
[45] Date of Patent: Aug. 10, 1999

[54] TEXT FIXTURE RETAINER FOR AN INTEGRATED CIRCUIT PACKAGE

[75] Inventor: H. Scott Fetterman, New Tripoli, Pa.

[73] Assignee: Lucent Technologies Inc., Murray Hill, N.J.

[21] Appl. No.: 09/123,370

[22] Filed: Jul. 27, 1998

[51] Int. Cl.[6] .................................................. H01L 23/32
[52] U.S. Cl. .................... 361/783; 257/688; 257/727; 439/73; 324/757
[58] Field of Search ................................. 361/783, 767, 361/820; 324/755, 757, 758; 257/688, 689, 726, 727; 439/73

[56] References Cited

U.S. PATENT DOCUMENTS

| | | | |
|---|---|---|---|
| 3,335,327 | 8/1967 | Damon et al. | 361/767 |
| 3,747,046 | 7/1973 | Watkins et al. | 361/767 |
| 3,874,768 | 4/1975 | Cutchaw | 439/72 |
| 4,468,074 | 8/1984 | Gordon | 439/296 |
| 5,006,962 | 4/1991 | Haley | 361/783 |
| 5,680,057 | 10/1997 | Johnson | 324/757 |
| 5,779,488 | 7/1998 | Cluff | 439/73 |
| 5,801,929 | 9/1998 | Cheng | 361/783 |

Primary Examiner—Leo P. Picard
Assistant Examiner—John B. Vigushin

[57] ABSTRACT

A retainer assembly for releasably securing an integrated circuit package to a circuit board for testing purposes includes an insulative plate having a central aperture which surrounds the package and captures the package leads between the plate and the circuit board with the leads in conductive engagement with respective conductive contact lands on the circuit board. Screws extending through openings in the plate and the circuit board are threadingly received in nuts secured to the underside of the circuit board to releasably secure the plate with the captured integrated circuit package to the circuit board.

7 Claims, 2 Drawing Sheets

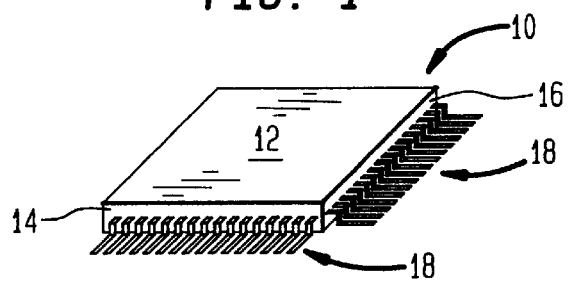
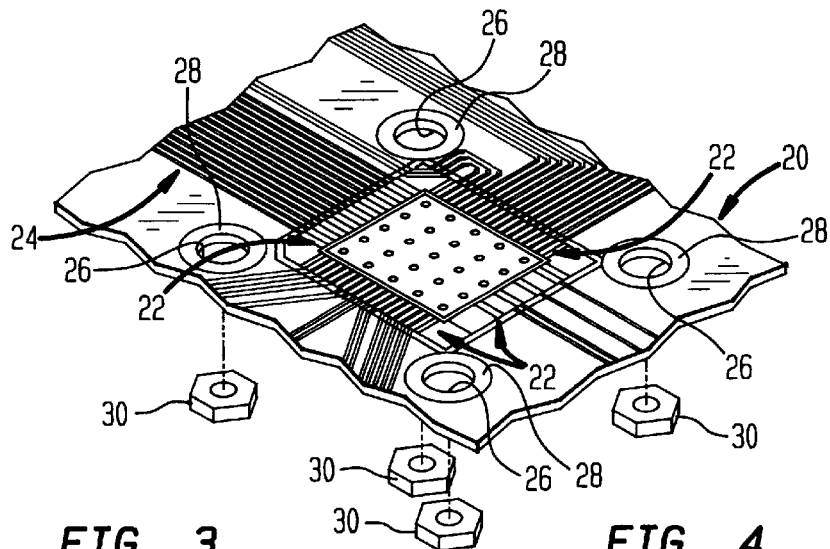
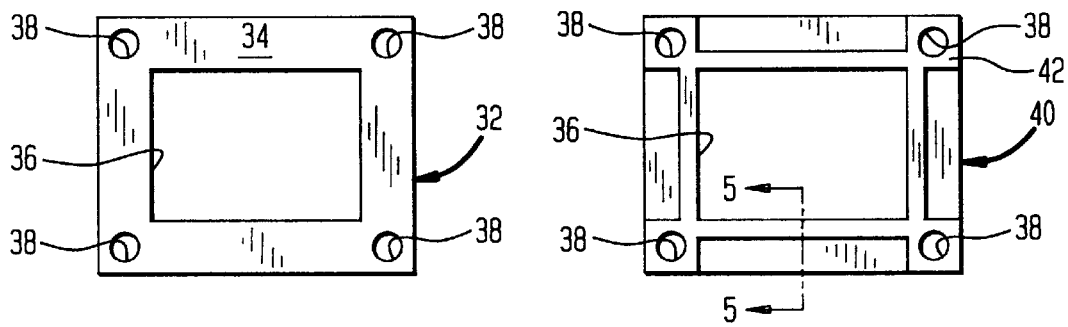
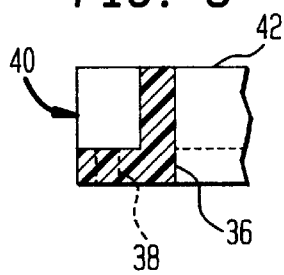

TEXT FIXTURE RETAINER FOR AN INTEGRATED CIRCUIT PACKAGE

BACKGROUND OF THE INVENTION

This invention relates to the testing of an integrated circuit package and, more particularly, to a retainer for releasably securing an integrated circuit package to a test fixture circuit board.

As part of the manufacturing process, integrated circuit packages are tested for quality control purposes. Typically, a test fixture for an integrated circuit package includes a printed circuit board having circuit components permanently mounted thereon and a socket or connector for receiving the integrated circuit package being tested. One problem with this type of arrangement is that, in the past, the integrated circuit package was held above the circuit board so that extra lead lengths were required to connect the package to circuitry on the board. The placing of such extra lead lengths in series with the integrated circuit package leads results in a disadvantageous increase in the lead inductance. Another problem is that the socket may hinder probing of the integrated circuit chip die surface. It would therefore be desirable to provide an arrangement in combination with a test fixture circuit board for an integrated circuit package which adds no additional lead inductance, allows easy alignment of the integrated circuit package and provides the ability to probe the die surface of the integrated circuit chip.

SUMMARY OF THE INVENTION

According to the present invention, there is provided a retainer assembly for releasably securing an integrated circuit package to a circuit board. The integrated circuit package includes a sealed insulative body with a plurality of conductive leads extending outwardly from an edge of the body. The circuit board includes a like plurality of conductive contact lands on a surface of the board, with each of the lands aligned to receive in conductive engagement thereon a respective one of the leads. The inventive retainer assembly includes an insulative plate having a generally planar surface and an aperture sized to receive the integrated circuit package body with the plurality of leads adjacent the surface of the plate. The assembly further includes a holder secured to the circuit board and adapted to engage the plate, thereby capturing the plurality of leads between the plate surface and the circuit board with the leads in conductive engagement with respective ones of the plurality of contact lands.

In accordance with an aspect of this invention, the plate is formed with a plurality of openings each in a region of the plate surface which is spaced from the plurality of leads. The holder comprises a plurality of internally threaded members secured to the circuit board, spaced from the plurality of contact lands, and each in registration with a respective one of the plate openings. The holder further comprises a plurality of externally threaded members each adapted to extend through a respective one of the plurality of plate openings. Each of the threaded members has an enlarged head at one end sized larger than a respective plate opening so as not to pass completely therethrough and each adapted to be threadingly received at its other end in a respective one of the internally threaded members.

In accordance with another aspect of this invention, the package body is a substantially flat rectilinear body having a pair of opposed major surfaces and four sides extending between the pair of major surfaces. Each of the plurality of leads extends outwardly from a respective side and is bent at a first location to extend parallel and close to its respective side toward one of the major surfaces and is bent at a second location to extend away from the package body substantially coplanar with that one major surface. The plate aperture is rectangular and is sized to surround the plurality of leads between the first and second locations with minimum clearance. Accordingly, each of the leads is captured distally beyond the second location between the plate surface and the circuit board.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1 is a perspective view of an integrated circuit package of the type to be held by a retainer assembly according to this invention;

FIG. 2 is a partial perspective view of a test fixture circuit board for cooperating with the package shown in FIG. 1;

FIG. 3 is a bottom plan view of an illustrative embodiment of a retainer plate according to this invention;

FIG. 4 is a bottom plan view of an alternative illustrative embodiment of a retainer plate according to this invention;

FIG. 5 is a cross sectional view taken along the line 5—5 in FIG. 4; and

DETAILED DESCRIPTION

Figure 6:
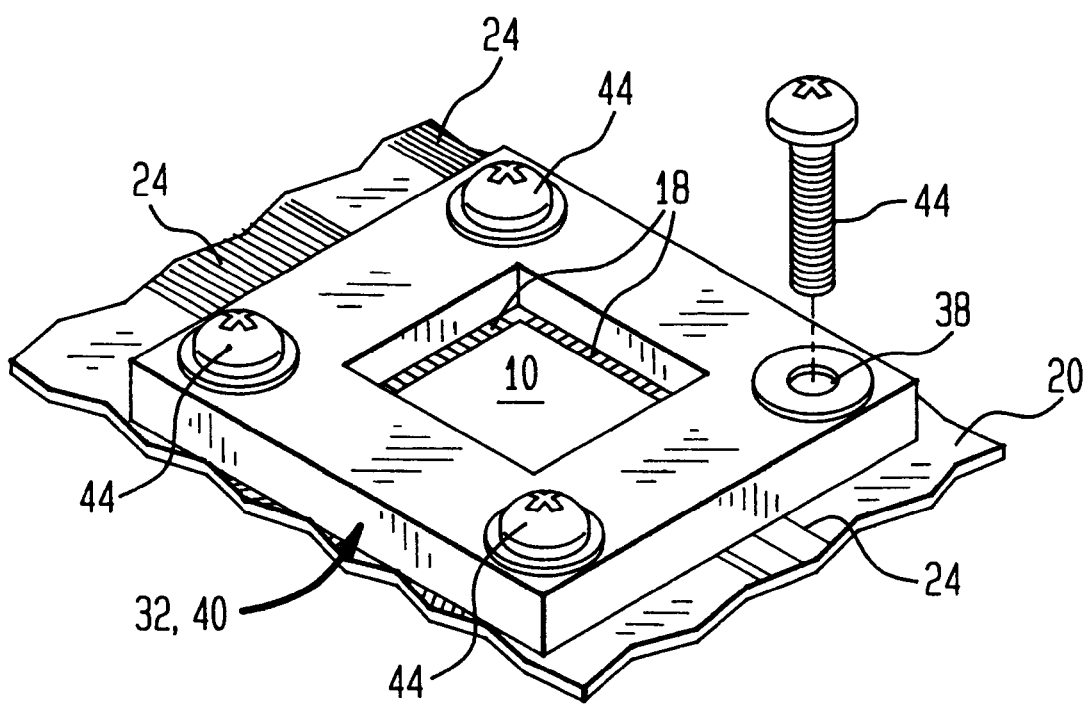
FIG. 6 is a partial perspective view of the circuit board shown in FIG. 2, showing the inventive retainer assembly holding in place an integrated circuit package.

Referring now to the drawings, FIG. 1 shows an integrated circuit package of the type with which the retainer assembly of the present invention is adapted to cooperate. The integrated circuit package shown in FIG. 1 is a "gull wing leaded" package such as a thin quad flat pack (TQFP) or a metric quad flat pack (MQFP). Such an integrated circuit package, designated generally by the reference numeral 10, is a substantially flat rectilinear sealed insulative body having a first (upper) major surface 12 and an opposed (lower) major surface (not shown) and four sides, of which only the sides 14 and 16 are visible, extending between the major surfaces. The package 10 further includes a plurality of conductive leads 18 extending outwardly from each of the sides. Each of the leads 18 is bent at a first location to extend parallel and close to its respective side toward the lower major surface and is bent at a second location to extend away from the package body substantially coplanar with the lower major surface.

FIG. 2 shows a portion of a printed circuit board, designated generally by the reference numeral 20, which is part of a test fixture and to which the package 10 is to be placed in electrical connection. Thus, conductive contact lands 22 are deposited on the circuit board 20 in a conventional manner. The contact lands 22 are placed in a rectangular array and each corresponds to a respective one of the leads 18 of the circuit package 10 which is to be tested by the test fixture of which the circuit board 20 forms a part. The contact lands 22 are coupled to respective conductive traces 24 deposited on the surface of the circuit board 20, as is conventional and known in the art. The circuit board 20 is formed with four openings 26 spaced from the contact lands 22 and positioned at the four corners of a rectangle. Each of the openings 26 is preferably a plated through-hole, as indicated by the plating 28 which is isolated from the conductive traces on the circuit board 20. Secured to the underside of each plating 28, as by cementing, soldering, welding, or the like, is a respective internally threaded nut 30.

The nuts 30 are a part of the inventive retainer assembly. FIG. 3 shows a retainer plate 32 which forms another part of the inventive retainer assembly. The plate 32 is formed of insulative material and has a generally planar lower surface 34. A rectangular aperture 36 is formed in the plate 32. The aperture 36 is sized to fit over the integrated circuit package 10 and surround the leads 18 with minimum clearance where they are parallel to the sides 14, 16. The plate 32 is further formed with four openings 38 positioned each at a respective corner of a rectangle. Each of the openings 38 is of substantially the same size as the openings 26 in the circuit board 20. The positions of the openings 38 match the positions of respective ones of the openings 26. Thus, when the plate 32 is placed over the package 10, the openings 38 are spaced from the leads 18 and may be aligned with respective ones of the openings 26 in the circuit board 20.

FIGS. 4 and 5 illustrate an alternative design for a retainer plate 40 wherein the generally planar lower surface 42 is milled out except for the areas immediately surrounding the openings 38 and immediately surrounding the central aperture 36.

The inventive retainer assembly further includes four headed screws 44 which are sized to pass through the openings 38 and 26 and be threadingly received in the nuts 30. The heads of the screws 44 are larger than the openings 38 so that the screws 44 do not pass completely therethrough.

To use the inventive retainer assembly, the integrated circuit package 10 being tested is placed on the circuit board 20 with the outwardly extending distal portions of its leads 18 engaging respective ones of the contact lands 22. The retainer plate 32, 40 is then placed over the package 10 and the screws 44 are inserted through the openings 38 and 26 and are tightened to the nuts 30. When the retainer plate 32, 40 is placed over the integrated circuit package 10, the outwardly extending distal portions of the leads 18 are captured between the lower surface 34, 42 of the retainer plate 32, 40 and the circuit board 20, and in conductive engagement with respective ones of the contact lands 22. By sizing the components of the inventive retainer assembly so that there is a close fit of the leads 18 in the rectangular aperture 36 of the plate 32 and a snug fit of the screws 44 in the openings 38 and 26 of the plate 32 and the circuit board 20, respectively, this insures proper alignment of the leads 18 with the contact lands 22.

Thus, by using the inventive retainer assembly, no additional lead lengths are required for testing the integrated circuit package 10 and therefore all disadvantageous added lead inductance is eliminated. An additional advantage of the inventive retainer assembly is that the plate aperture 36 exposes the top of the integrated circuit package 10 and, if the package is opened, the surface of the internal integrated circuit die may be probed.

By milling out the lower surface 42 of the retainer plate 40, this allows components on the top surface of the circuit board 20 to be placed closer to the package 10 being tested than would otherwise be possible.

Accordingly, there has been disclosed an improved test fixture releasable retainer assembly for an integrated circuit package. While illustrative embodiments of the present invention have been disclosed herein, it is understood that various modifications and adaptations to the disclosed embodiments are possible and it is intended that this invention be limited only by the scope of the appended claims.

What is claimed is:

1. A retainer assembly for releasably securing an integrated circuit package to a circuit board, wherein the integrated circuit package includes a sealed insulative body with a plurality of conductive leads extending outwardly from a side of the body and the circuit board includes a like plurality of conductive contact lands on a surface of the board each aligned to receive in conductive engagement thereon a respective one of said leads, said retainer assembly comprising:

an insulative plate having a generally planar surface and an aperture therethrough sized to receive said package body with said plurality of leads adjacent said surface of said plate; and a holder secured to said circuit board and adapted to engage said plate to capture said plurality of leads between said plate surface and said circuit board with said plurality of leads in conductive engagement with respective ones of said plurality of contact lands;

wherein said plate includes a thickened region surrounding said aperture and extending out from said aperture a distance sufficient to capture said plurality of leads between said thickened region and said plurality of contact lands on said circuit board; and wherein said plate is recessed distally beyond said distance from said aperture;

whereby additional components can be mounted to the circuit board in close proximity to the integrated circuit package.

2. The assembly according to claim 1 wherein said plate is formed with a plurality of openings each in a region of said plate surface spaced from said plurality of leads, and said holder comprises:

a plurality of internally threaded members secured to said circuit board, spaced from said plurality of contact lands, and each in registration with a respective one of said plate openings; and a plurality of externally threaded elongated members each adapted to extend through a respective one of said plurality of plate openings, each of said threaded members having an enlarged head at one end sized larger than the respective plate opening so as not to pass completely therethrough and each adapted to have its other end be threadingly received in a respective one of said internally threaded members.

3. The assembly according to claim 2 wherein said plurality of internally threaded members are secured to a surface of said circuit board opposite the surface having said plurality of contact lands and said circuit board is formed with a plurality of openings each aligned with a respective one of said plurality of internally threaded members and each adapted to receive therethrough a respective one of said plurality of externally threaded elongated members.

4. The assembly according to claim 3 wherein each of said plurality of externally threaded members comprises a headed threaded screw and each of said internally threaded members comprises a nut which is complemental to said screw.

5. The assembly according to claim 4 wherein said plurality of plate openings and said plurality of circuit board openings are sized to provide a snug fit for said plurality of screws.

6. The assembly according to claim 4 wherein each of said circuit board openings comprises a plated through-hole and each of said nuts is secured to the plating of a respective one of said circuit board openings.

7. The assembly according to claim 1 wherein:

said package body is a substantially flat rectilinear body having a pair of opposed major surfaces and four sides extending between said pair of major surfaces, and each of said plurality of leads extends outwardly from a respective side, each of said plurality of leads being bent at a first location to extend parallel and close to its respective side toward one of said major surfaces and being bent at a second location to extend away from said package body substantially co-planar with said one major surface; and said plate aperture is rectangular and sized to surround said plurality of leads between said first and second locations with minimum clearance;

whereby each of said leads is captured distally beyond said second location between said plate surface and said circuit board.

* * * * *